(12) United States Patent
Noguchi

(10) Patent No.: US 9,076,503 B2
(45) Date of Patent: Jul. 7, 2015

(54) SEMICONDUCTOR DEVICE

(75) Inventor: Hidekazu Noguchi, Tokyo (JP)

(73) Assignee: PS4 Luxco S.a.r.l., Luxembourg (LU)

( * ) Notice: Subject to any disclaimer, the term of this patent is extended or adjusted under 35 U.S.C. 154(b) by 351 days.

(21) Appl. No.: 13/493,353

(22) Filed: Jun. 11, 2012

(65) Prior Publication Data

US 2012/0320699 A1 Dec. 20, 2012

(30) Foreign Application Priority Data

Jun. 15, 2011 (JP) ................................ 2011-133337

(51) Int. Cl.
*G11C 5/14* (2006.01)
*G11C 8/08* (2006.01)

(52) U.S. Cl.
CPC ....................... *G11C 8/08* (2013.01)

(58) Field of Classification Search
CPC ...... G11C 11/4085; G11C 5/063; G11C 8/08; G11C 8/14

USPC .................................... 365/226, 227, 189.09
See application file for complete search history.

(56) References Cited

U.S. PATENT DOCUMENTS

| | | | |
|---|---|---|---|
| 2002/0048184 A1* | 4/2002 | Kang et al. ..................... | 365/145 |
| 2008/0159055 A1 | 7/2008 | Lee et al. | |
| 2009/0097304 A1* | 4/2009 | Choi et al. ..................... | 365/163 |
| 2011/0299355 A1* | 12/2011 | Rana ....................... | 365/230.06 |

FOREIGN PATENT DOCUMENTS

| | | |
|---|---|---|
| JP | 04-42494 A | 2/1992 |
| JP | 09-312097 A | 12/1997 |
| JP | 2002-170398 A | 6/2002 |
| JP | 2008-135099 A | 6/2008 |

* cited by examiner

*Primary Examiner* — Han Yang
(74) *Attorney, Agent, or Firm* — Kunzler Law Group, PC

(57) ABSTRACT

A word driver drives a word line with a first power supply voltage and with a second power supply voltage which has a potential lower than the first power potential, respectively in a first time period and in a second time period following the first time period for activating the word line.

19 Claims, 9 Drawing Sheets

SEMICONDUCTOR DEVICE

REFERENCE TO RELATED APPLICATION

This application is based upon and claims the benefit of the priority of Japanese patent application No. 2011-133337, filed on Jun. 15, 2011, the disclosure of which is incorporated herein in its entirety by reference thereto.

TECHNICAL FIELD

The present invention relates to a semiconductor device. More specifically, the invention relates to a semiconductor device including a memory cell array.

BACKGROUND

A semiconductor device including a memory cell array having a plurality of memory cells, each of which writing and reading can be performed, includes a plurality of word lines each connected in common to gates of a plurality of memory cell transistors. One of the word lines selected by a row decoder (X decoder) that decodes a row address is driven to an activation potential by a word driver to cause the memory cell transistors connected to the activated word line to be turned on (conductive). Then, data is read from or written to the memory cell connected to a column (bit line) selected by a column decoder that decodes a column address.

Recently, in the semiconductor device including such a memory cell array, it has become difficult to reduce a rise time of a selected word line from a low potential to the activation potential (high potential), due to an influence of an increase in the number of the cells connected to the word line, an increase in word line length, or the like. The increase in the number of the cells is caused by a higher integration density achieved by the dimension scaling down of the semiconductor processing. The increase in word line length is caused by a demand for chip size reduction.

Further, recently, there is adopted a memory cell array of a hierarchical word line structure including a plurality of word lines (sub word lines) for one main word line. In the case of the hierarchical word line structure, a main word line to which word lines (sub word lines) belong is activated, and a selected one out of the word lines that belong to the main word line is activated to an activation potential (high potential). Due to a time constant of wiring resistance and a load capacitance, a far end side of the word line rises to the activation potential (high potential) being delayed from a near end side of the word line. The delay of activation of the word line leads to a delay in a data amplification operation after the activation of the word line and an access time of read and write operation.

In Patent Document 1, for example, there is disclosed use of a boosted voltage higher than a power supply voltage for driving of a word line, as a High potential (activation potential) of the word line.
Patent Document 1
JP Patent Kokai Publication No. JP2002-170398A

SUMMARY

The following is given as an analysis of the related art.

As mentioned above, in a semiconductor device including a memory cell array, the speed up of a rise time of a word line and chip size reduction are demanded.

It is well known that the chip size reduction and an increase in operation speed are technical trends in the semiconductor device.

An increase in the size of a memory cell mat region enclosed by sense amplifiers (SAMPs) and word drivers (SWDs) (increase in the number of memory cells of a single memory cell mat from 256 cells to 512 cells per word line/bit line) may be a one idea. In this case, however, a parasitic capacitance (load) of each memory cell will double. For this reason, the increase in operating speed may be hindered. Especially, the delay of activation of the word line leads to a delay in a subsequent data amplification operation in a sense amplifier and a delay in an access time of read and write operation and hence the delay of activation of the word line is undesirable.

The present invention has been made in order to solve at least one of the above-mentioned problems. The invention is configured as follows, though not limited thereto:

There is provided a semiconductor device comprising:
a memory cell transistor;
a word line connected to the memory cell transistor; and
a word driver driving the word line when the word line is selected, wherein the word driver drives the word line with a first power supply voltage and with a second power supply voltage respectively in a first time period and in a second time period following the first time period to activate the word line, the first power supply voltage being greater than the second power supply voltage.

According to the present invention, a delay in a rise of a word line to an activation potential can be avoided. For this reason, chip size reduction and an increase in operating speed can be accommodated. Characteristics and effects other than the ones mentioned above will become apparent from the following description and appended drawings which just illustrate some of the preferred modes of the present invention (and are not to limit the present invention) by those skilled in the art.

Still other features and advantages of the present invention will become readily apparent to those skilled in this art from the following detailed description in conjunction with the accompanying drawings wherein only exemplary embodiments of the invention are shown and described, simply by way of illustration of the best mode contemplated of carrying out this invention. As will be realized, the invention is capable of other and different embodiments, and its several details are capable of modifications in various obvious respects, all without departing from the invention. Accordingly, the drawing and description are to be regarded as illustrative in nature, and not as restrictive.

EMBODIMENTS

Figure 1:
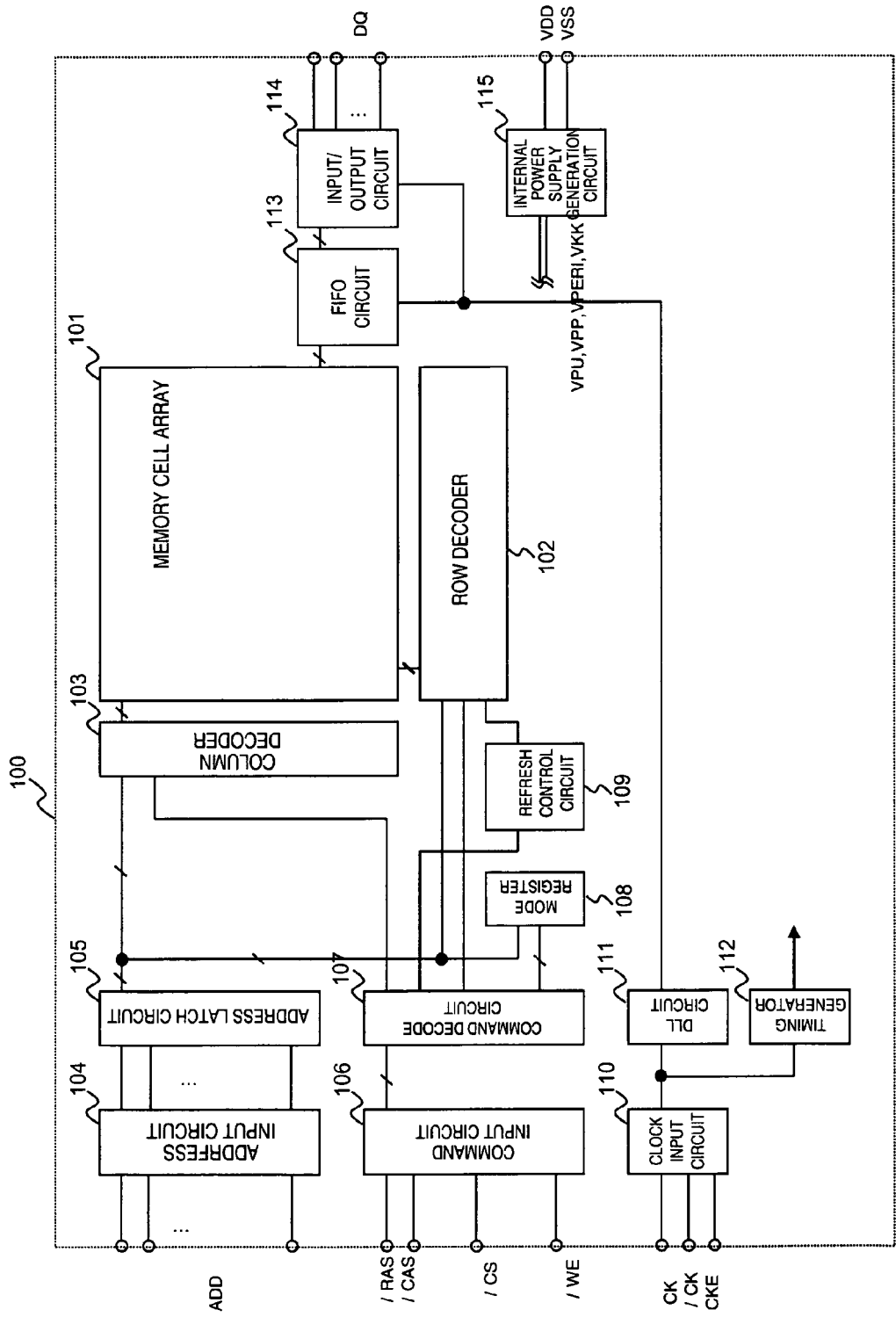
FIG. 1 is a diagram illustrating a configuration of an exemplary embodiment of the present invention.

According to one of embodiments, when a word line rises, a power supply voltage of a high potential is used in a first time period in order to drive the word line at high speed, and then in a second time period following the first time period, the word line is held at a power supply voltage of a potential lower than the power supply voltage of the high potential. More specifically, a semiconductor device according to the present invention comprises: a memory cell capacitor; a memory cell transistor provided between the memory cell capacitor and a bit line; a word line connected to a control electrode of the memory cell transistor; and a word driver that drives the word line. The word driver drives, in a first time period and a second time period following the first time period, for activating the selected word line, the word line respectively with a first power supply voltage with a second power supply voltage, wherein the first power supply voltage has a higher potential than the second power supply voltage.

According to one of the embodiments, the word driver may comprise an output circuit that includes a first transistor (one of PM1_0 to PM1_3 in FIG. 3) that connected between a high-potential power supply terminal and the word line (one of SWL_k0 to SWL_k3 in FIG. 3), and is turned on to drive the word line to a potential of the high-potential power supply terminal when the word line (one of SWL_k0 to SWL_k3) is selected; and a second transistor (one of NM2_0 to NM2_3 in FIG. 3) that is connected between the word line (one of SWL_k0 to SWL_k3) and a low-potential power supply terminal (VKK), and is turned on to set the word line (one of SWL_k0 to SWL_k3) to a low potential when the word line (one of SWL_k0 to SWL_k3) is not selected.

The semiconductor device may further comprise a driving power supply circuit (FX_drv) that has an output (FXT) connected to the high-potential power supply terminal (one of FTX_0 to FXT_3) of the output circuit. The driving power supply circuit (FX_drv) provides the first power supply voltage and the second power supply voltage (VPP) to the high-potential power supply terminal (one of FTX_0 to FXT_3) of the output circuit when the word line (one of SWL_k0 to SWL_k3) is selected and activated.

According to one of the embodiments, the driving power supply circuit (FX_drv) includes a booster circuit that includes a first capacitor (C1 in FIG. 4) that has one end connected to a node (FXBST in FIG. 4) that is charged with the second power supply voltage (VPP), when activating the selected word line. The boosting circuit switches the other end of the first capacitor (C1) from a low potential (VSS) to the second power supply voltage (VPP), thereby boosting the node (FXBST) to the first power supply voltage having a higher potential than the second power supply voltage (VPP). The driving power supply circuit (FX_drv) may supply from the output the first power supply voltage at the node (FXBST) obtained by the boosting by the booster circuit to the high-potential power supply terminal one of FTX_0 to FXT_3 in FIG. 3) of the output circuit of the word driver, in the first time period. The driving power supply circuit may electrically disconnect the node (FXBST in FIG. 4) of the booster circuit from the output, and may supply the second power supply voltage (VPP) to the high-potential power supply terminal (one of FTX_0 to FXT_3 in FIG. 3) of the output circuit, in the second time period.

Figure 3:
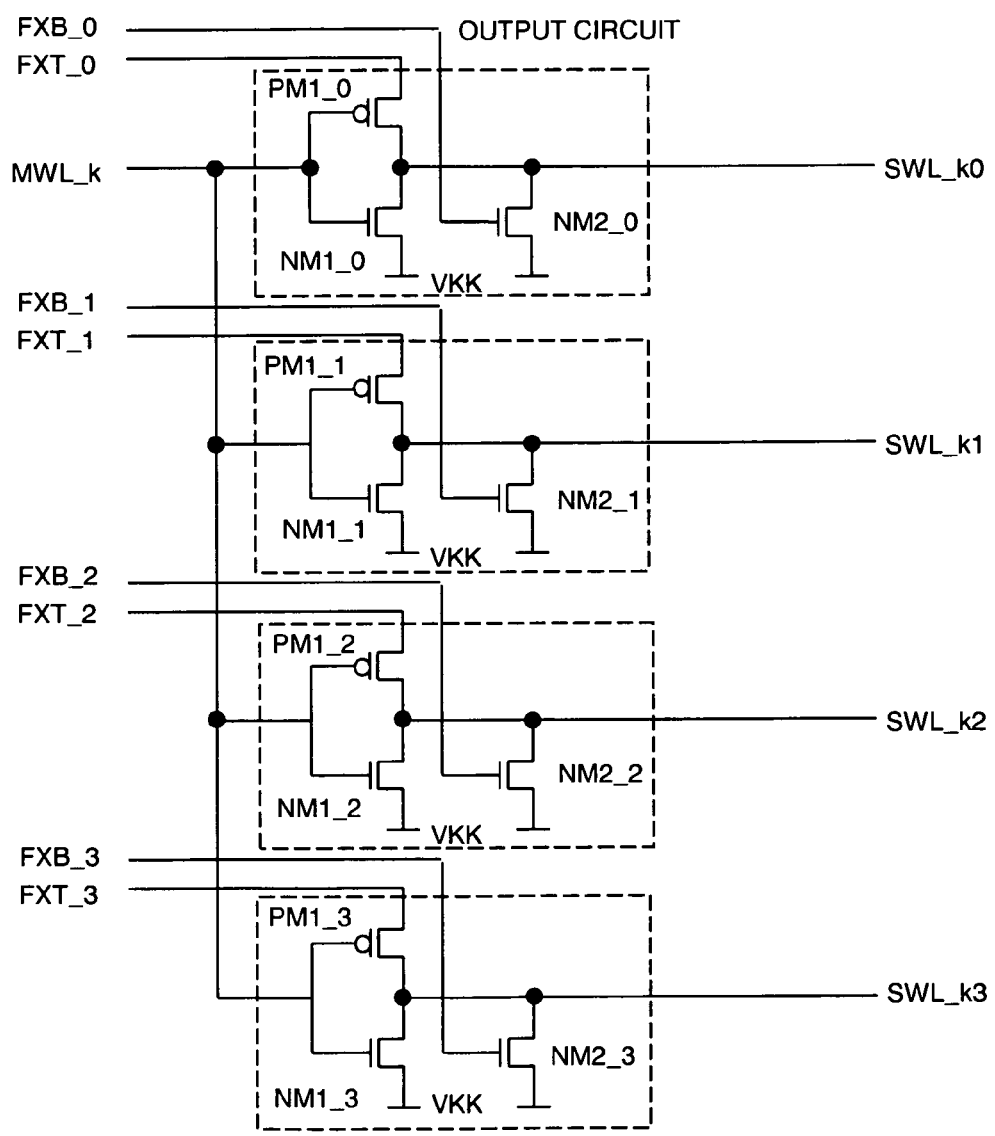
FIG. 3 is a diagram illustrating an example of a configuration of a sub word driver (SWD) in the exemplary embodiment of the present invention.

According to one of the embodiments, the word driver comprises a plurality of the output circuits ((PM1_0, NM1_0, NM2_0) to (PM1_3, MN1_3, NM2_3) in FIG. 3) respectively connected to a plurality of the word lines (SWL_k0 to SWL_k3 in FIG. 3), and the plurality of the output circuits ((PM1_0, NM1_0, NM2_0) to (PM1_3, MN1_3, NM2_3)) composes a subword driver (SWD) that receives a main word line (MWL_k in FIG. 3) provided for the plurality of the word lines (SWL_k0 to SWL_k3), in common. When the main word line (MWL_k) is selected and one of the plurality of the word lines (SWL_k0 to SWL_k3) is selected as a result of decoding of a row address, one of the plurality of the output circuits connected to the selected word line (one of SWL_k0 to SWL_k3) may drive the selected word line by the power supply voltage supplied from the driving power supply circuit (FX_drv) to the high-potential power supply terminal (one of FXT_0 to FXT_3), and a low potential may be given from the output of the driving power supply circuit to the high-potential power supply terminal of each of the plurality of the output circuits connected to the remainder of the plurality of the word lines not selected. When the main word line (MWL_k in FIG. 3) is not selected and is deactivated, the plurality of the output circuits ((PM1_0, NM1_0, NM2_0) to (PM1_3, NM1_3, NM2_3)) that receive the main word line (MWL_k) in common may set the plurality of the word lines (SWL_k0 to SWL_k3) respectively connected to the plurality of the output circuits to a low-potential power supply voltage (VKK).

According to one of the embodiments, the driving power supply circuit (FX_drv) comprises a plurality of driving circuits corresponding to the plurality of the output circuits. Each of the plurality of driving circuits comprises:

a third transistor (one of PM11_0 to PM11_3 in FIG. 4) that receives a first signal (one of FXb2_0 to FXb2_3 in FIG. 4) output as the result of decoding of the row address and is turned on to drive the output to the second power supply voltage (VPP) when the first signal (one of FXb2_0 to FXb2_3 in FIG. 4) indicates that the word line is selected; and a fourth transistor (one of NM11_0 to NM11_3 in FIG. 4) that receives a second signal (one of RFX_0 to RFX_3 in FIG. 4) output as the result of decoding of the row address and is turned on to set the output to a low potential when the second signal tone of RFX_0 to RFX_3) is deactivated (at VSS).

The booster circuit is provided in common to the plurality of the output circuits.

A plurality of first switch elements (PM12_0 to PM12_3 in FIG. 4) are provided between the node (FXBST) of the booster circuit and the output (FXT_0 to FXT_3) of each of the plurality of driving circuits.

After the third transistor (PM11_*i* being one of 0 to 3) of the driving circuit connected to the high-potential power supply terminal of the output circuit that drives the selected word line drives the output (one of FXT_0 to FXT_3)) to the second power supply voltage (VPP), in the first period, the third transistor (PM11_)) is turned off, one (PM12_*i*) of the first switch elements (PM12_0 to PM12_3) connected to the output (FXT_i) of the driving circuit corresponding to the output circuit connected to the selected word line is turned on to connect the boosted node (FXBST) to the output (FXT_i) of the driving circuit, and the first power supply voltage is supplied to the high-potential power supply terminal of the output circuit from the output, thereby driving the selected word line (one of SWL_k0 to SWL_k3) to the first power supply voltage. In the second time period following the first time period, the first switch element (PM12_i) that has been turned on in the first time period is turned off, the third transistor (PM11_)) is turned on again to set the output of the driving circuit to the second power supply voltage (VPP), and the second power supply voltage (VPP) is supplied to the high-potential power supply terminal of the output circuit to set the selected word line (one of SWL_k0 to SWL_k3) to the second power supply voltage (VPP).

According to one of the embodiments, the booster circuit comprises a second switch element (PM13 in FIG. 4) connected between the node (FXBST) and a power supply terminal supplied with the second power supply voltage (VPP) and a second capacitor (C2 in FIG. 4) between the node (FXBST) and a low-potential power supply terminal. The second switch element (PM13) is turned on immediately before the first time period to charge the node (FXBST) to the second power supply voltage (VPP). The second switch element (PM13) is turned off in the first time period.

According to one of the embodiments, the semiconductor device comprises first and second power supplies (internal power supply generation circuit: 115 in FIG. 1) that respectively generate the first supply voltage (VPU) and the second power supply voltage (VPP). The driving power supply circuit (FX_drv) includes a driving circuit including:

a fifth transistor (PM25 in FIG. 6) inserted between the output (FXT_0-3) and a power supply terminal to which the first power supply voltage (VPU) from the first power supply is applied;

a sixth transistor (PM23 in FIG. 6) inserted between the output (FXT) and a power supply terminal to which the second power supply voltage (VPP) from the second power supply is applied; and a circuit (NAND, PM21, PM22, NM22, NM24 in FIG. 6) that performs control such that the output (FXT) connected to the high-potential power supply terminal of the output circuit to the word line not selected is set to a low potential (by NAND, NM21 in FIG. 6), based on a signal output as a result of decoding of a row address. In the first time period, the high-potential power supply terminal of the output circuit connected to the selected word line is driven by the first power supply voltage (VPU) by turning on the fifth transistor (PM25 in FIG. 6) and turning off the sixth transistor (PM23 in FIG. 6), and in the second time period, the high-potential power supply terminal of the output circuit connected to the selected word line is driven by the second power supply voltage (VPP) by turning off the fifth transistor (PM25 in FIG. 6) and turning on the sixth transistor (PM23 in FIG. 6). The driving circuit in the driving power supply circuit comprises a circuit (NAND, MN21 in FIG. 6) that sets the high-potential power supply terminal of the output circuit connected to the word line not selected to the low potential (VSS).

Figure 8:
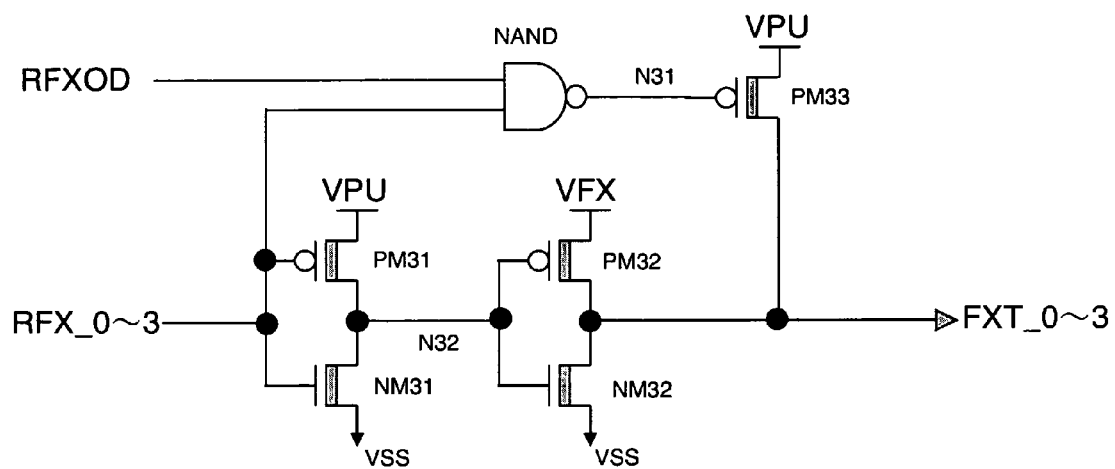
FIG. 8 is a diagram illustrating a configuration of a driving circuit in an FX driver (Fx_drv) circuit in a third embodiment.

According to one of the embodiments, the semiconductor device comprises a first power supply that generates the first power supply voltage (VPU) and a third power supply (VFX) that may switch between the first and second power supply voltages (internal power supply generation circuit: 115 in FIG. 1). The driving power supply circuit (FX_drv) comprises a driving circuit including:

a first circuit (e.g., CMOS inverter (PM31, NM31) in FIG. 8) that is arranged between a power supply terminal to which the first power supply voltage (VPU) is applied and a low-potential power supply terminal and receives a signal output as a result of decoding of a row address;

a second circuit (e.g., CMOS inverter (PM32, NM32) in FIG. 8) that is arranged between a power supply terminal of the third power supply (VFX) and a low-potential power supply terminal and receives an output of the first circuit (e.g., CMOS inverter (PM31, NM31) in FIG. 8);

a third switch element (PM33 in FIG. 8) arranged between a power supply terminal to which the first power supply (VPU) is applied and the output (FXT_0-3); and a logic circuit (NAND in FIG. 8) that performs control such that when a signal (RFX_0-3) output as the result of decoding of the row address indicates that the word line is selected, the third switch element (PM33) is turned on in the first time period and the third switch element (PM33) is turned off in the second time period, based on a signal (RFXOD) that controls the first time period and the signal (RFX_0-3) output as the result of decoding of the row address. The driving circuit in the driving power supply circuit (FX_drv) drives the high-potential power supply terminal (one of FXT_0-3 in FIG. 8) of the output circuit connected to the selected word line with the first power supply voltage (VPU), in the first time period, when the third power supply (VFX in FIG. 8) is set to the first power supply voltage (VPU). The output (one of FXT_0-3) is set to the first power supply voltage (VPU). The driving circuit in the driving power supply circuit (FX_drv) drives the high-potential power supply terminal (one of FXT_0-3 in FIG. 8) of the output circuit connected to the selected word line with the second power supply voltage (VPP) in the second time period when the third power supply (VFX in FIG. 8) is switched to the second power supply voltage (VPP), and the output (FXT) is set to the second power supply voltage (VPP) that is the voltage of the third power supply (VFX) output from the second circuit (e.g., CMOS inverter (PM32, NM32) in FIG. 8). The word driver comprises a plurality of the output circuits respectively connected to a plurality of the word lines, the plurality of the output circuits compose a subword driver that receives a main word line provided for the plurality of the word lines, in common. The semiconductor device comprises a plurality of the driving circuits corresponding to the plurality of the output circuits.

FIG. 1 is a diagram schematically illustrating an example of an overall configuration of a synchronous semiconductor memory, which is one of synchronous semiconductor devices. Though a clock synchronous DRAM (Dynamic Random Access Memory) will be described as an example of a semiconductor memory, the present invention is not limited to the following DRAM. The present invention may be applied to a volatile memory such an SRAM (Static Random Access Memory) and non-volatile memories such a PCRAM (Phase Change Random Access Memory), an MRAM (Magnetoresistive Random Access Memory) and an ReRAM (Resistance Random Access Memory).

Referring to FIG. 1, a memory cell array 101 includes a plurality of memory cells arranged at intersections between word lines WL and bit lines BL in the form of an array. As will be described later, a memory cell is assumed to be a DRAM cell including one MOS transistor and one capacitor associated with the MOS transistor. A word line is connected to a gate of the memory cell, one of a source and a drain of the memory cell transistor is connected to a bit line, and the other of the source and the drain of the memory cell transistor is connected to the capacitor.

An address input circuit 104 is an input circuit (receiver) that receives an address signal comprising a plurality of bit signals externally supplied to address terminals ADD. An address latch circuit 105 latches the address signal externally supplied to the address terminals ADD, and supplies a row address signal and a column address signal to a row decoder (X decoder) 102 and to a column decoder (Y decoder) 103, respectively.

The row decoder (X decoder) 102 decodes the row address signal to select a word line, and drives the word line selected by a word driver not shown to an activation potential (high potential).

The column decoder 103 decodes the column address, turns on a column switch (not shown) of a selected column (bit line), and connects a sense amplifier (not shown) of the selected column to an input/output line (not shown).

A command input circuit 106 receives a command signal. Though no particular limitation is imposed, a combination of signal values of a /CS (chip select) signal, a /RAS (row address strobe) signal, a /CAS (column address strobe) signal, and a /WE (write enable) signal and a predetermined address signal bit field are received by the command input circuit 106 as a command parameter (parameter).

A command decoder (decode circuit) 107 decodes the command signals, and gives a result of the decoding to the column decoder 103, the row decoder 102, a refresh control circuit 109.

A parameter (indicating a burst length, for example) that specifies an operation mode of the synchronous semiconductor memory is set in a mode register 108 by a mode register set command which is supplied as a command signal to the synchronous semiconductor memory.

The refresh control circuit 109 controls refreshing of the memory cell array 101 by input of a refresh command (or self refreshing). In refreshing the memory cell array 101, a refresh address is supplied to the row decoder 102, and data in a memory cell on a selected word line on the memory cell array is read to a bit line. The data is amplified by a sense amplifier, and is then written back to the original memory cell.

A clock input circuit 110 differentially receives complementary clock signals CK and /CK externally supplied, receives a clock enable signal CKE, and then outputs an internal clock signal (internal reference clock signal). Operation of an internal circuit including a sequential circuit such as a flip-flop is performed in synchronization with the internal clock signal. When the clock enable signal CKE is low, the operation at a rising edge of a next clock CK (at a falling edge of a next clock /CK) is neglected, so that an internal operation is not performed. When the clock enable signal CKE is High, the clock input circuit 110 outputs the internal clock signal synchronized with the clock signals CK and /CK.

A DLL (Delay-Lock Loop) 111 receives the external clock signals CK and /CK and outputs a clock signal delayed by a variable delay circuit. An output from the variable delay circuit is fed to a phase comparator through a dummy buffer, which is a dummy circuit of an output buffer circuit connected to a terminal DQ. The phase comparator compares the input clock with a signal from the dummy circuit. The delay time of the variable delay circuit is variably set, based on a result of the comparison by the phase comparator.

Referring to FIG. 1, a timing generator 112 receives the internal clock signal from the clock input circuit 110 to generate various types of timing signals.

An input/output circuit 114 includes output buffers (not shown) for respectively driving data input/output terminals DQ and receiver circuits (not shown) for respectively receiving bit data (write data) supplied to the data input/output terminals DQ. When the data is received by the receiver circuits, the output buffer circuits are output-disabled (or the outputs are set to a high-impedance state)

Parallel bit data (e.g., 4-bit data) read in parallel from a selected plurality of columns (e.g., four columns in case a burst length is four) of the memory cell array 101 is once written to a FIFO (First In First Out) circuit 113, and is then output to the terminals DQ through the input/output circuit 114, with a predetermined latency. In the synchronous DRAM (SDRAM), the predetermined latency corresponds to a CAS latency which is the number of clock cycles from input of a READ command to output of first bit data from the terminal DQ. The clock signal from the DLL circuit 111 is supplied to the FIFO circuit 113 and the input/output circuit 114. The FIFO circuit 113 is a buffer circuit in a read system, and includes a memory FIFO (First In First Out) of a first in first out system, a control unit (not shown) for controlling writing to and reading from the memory FIFO, and a parallel-to-serial conversion circuit (not shown) for converting parallel bits output from the memory FIFO to a serial bit. The input/output circuit 114 captures the bit data transferred from the FIFO circuit 113 into a register (not shown), using the clock signal from the DLL circuit 111 to perform timing adjustment, and supplies the bit data to the output buffers (not shown). Then, the output buffers (not shown) drive the DQ terminals and wirings connected to the terminals.

An internal power supply generation circuit 115 generates internal power supplies (a voltage VPU and a boosted voltage VPP, which will be described later). The voltage VPU and the voltage VPP are high voltages, a voltage VPERI is an internal operation voltage, a voltage VKK is a negative voltage lower than a GND potential (0V). A potential of a non-selected word line is set to the negative voltage VKK. Referring to FIG. 1, the internal power supply generation circuit 115 outputs the voltage VPU. In a first embodiment that will be described below, however, a level of the voltage VPU is generated by a generation circuit of an FX signal that provides a high potential of a word line. Thus, it is not necessary to generate the power supply voltage VPU at the internal power supply generation circuit 115. Potential levels of these voltages are in a relationship of VPU>VPP>VDD>VPERI>VSS (=0V)>VKK.

Reference symbols FXT/FXB, and (Main Word Line: main word line) that will be described with reference to FIG. 2 and subsequent drawings are all generated by the row decoder that receives and decodes the row address from the address latch circuit 105 receiving the row address supplied to the address terminals in correspondence with an ACT (activate bank) command.

Figure 2:
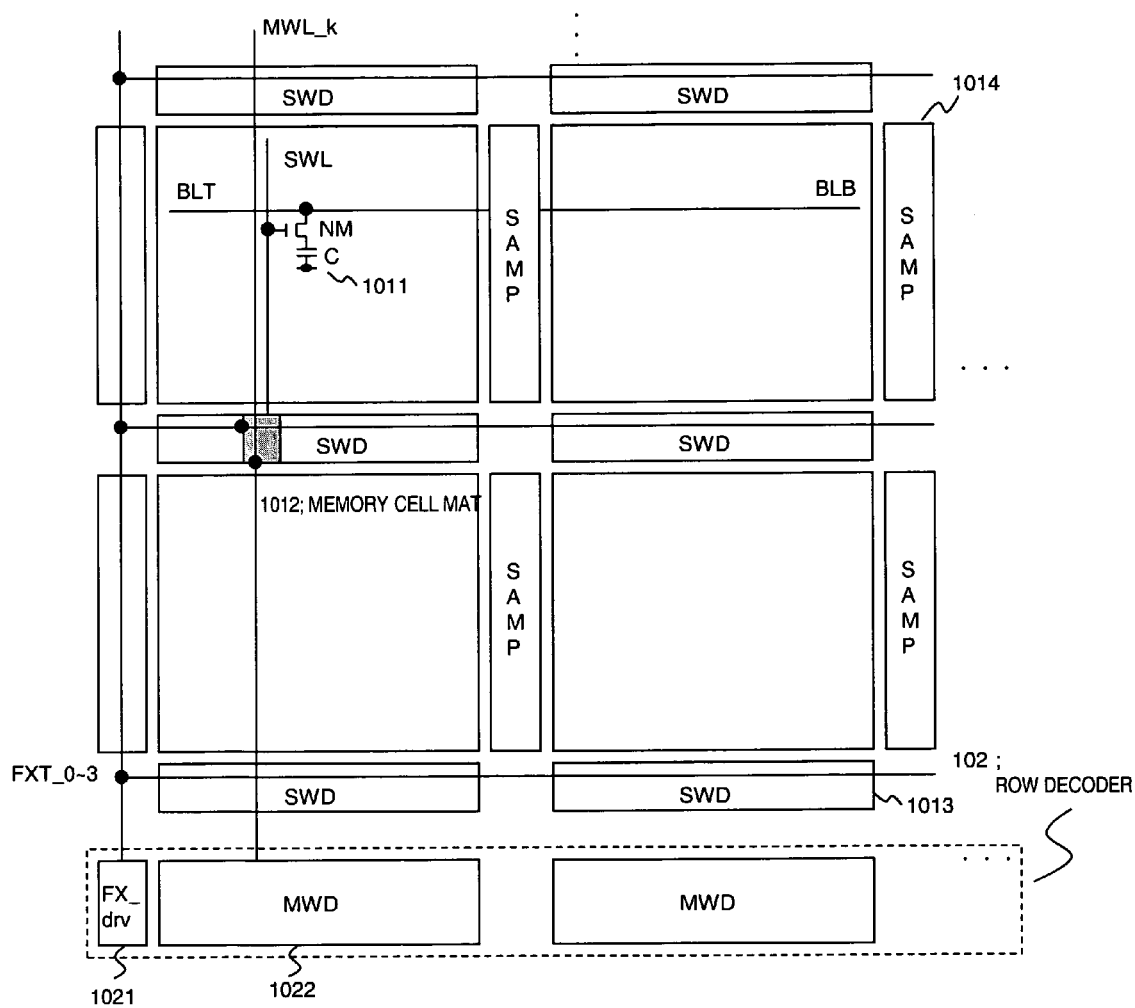
FIG. 2 is a diagram illustrating an example of a configuration of a memory cell array in the exemplary embodiment of the present invention.

FIG. 2 is a diagram illustrating enlargement of a portion of the memory cell array 101 in FIG. 1. The memory cell array 101 is assumed to be of a hierarchical word line structure. In the hierarchical word line structure, metal interconnects (MWLs) are arranged with spaces on a metal layer over a semiconductor substrate (silicon substrate), and four to eight gate polysilicon interconnects (SWLs: Sub Word Lines) underlying the metal layer are arranged with respect to each of these metal interconnects (MWLs), for example. Then, one of a plurality of word lines (SWLs) is selected by a sub word driver (SWD: Sub Word Driver) that receives an activated MWL, and the sub word driver drives the selected word line to a potential (boosted potential) higher than the internal power supply voltage VDD.

The memory cell array 101 is constituted from a plurality of memory cell mats (also referred to as "memory mats") 1012. A memory mat is a memory cell region allocated corresponding to sub word drivers (SWD) 1013 and sense amplifiers (SAMPs) 1014. The memory mats are arranged in the form of a lattice in one direction where the word lines (SWLs) are extended and a direction orthogonal to the one direction where bit lines (BLT/BLB) are extended.

As mentioned before, a memory cell 1011 is constituted from an NMOS transistor NM having a gate connected to a word line (SWL) and having a first terminal (drain or source) thereof connected to a bit line BLT, for example, and a capacitor C having one end connected to a power supply (plate power supply) and the other end thereof connected to a second terminal (source or drain) of the NMOS transistor NM. Reference symbol "T" of the bit line BLT and reference symbol "B" of the bit line BLB respectively indicate True and Bar. The bit lines BLT and BLB constitute a complementary bit line pair. In the example shown in FIG. 2, a sense amplifier sandwiched between the memory cell mats on right and left sides of FIG. 2 is connected to each of the bit lines BLT and BLB on the right and left sides through switches not shown. The bit line BLT or BLB and a dummy bit line not shown, for example, are connected to a sense amplifier located on each end of the memory cell array 101. A plurality of sense amplifiers arranged corresponding to the bit lines in the memory cell mats constitutes the sense amplifiers (SAMP) 1014. When data is read from the memory cell 1011 in FIG. 2, a voltage at the capacitor C of the memory cell 1011 is read to the bit line BLT precharged in advance to a precharge voltage, through the NMOS memory cell transistor NM of the memory cell 1011 that is turned on by activation of the word line (SWL). Then, the sense amplifier connected to the bit line BLT and the complementary bit line BLB of a memory cell mat adjacent to the right of the memory cell including the selected memory cell 1011 is activated, potentials at the bit lines BLT and BLB are differentially amplified to be transmitted to an input/output line through a column switch that is turned on. FIG. 2 illustrates an open bit line system, as a bit line structure. The embodiments, however, are not limited to such a configuration, and a folded line system may be of course employed. In this system, memory cells respectively connected to an adjacent one of word lines are alternately connected to bit lines BLT and BLB.

In the hierarchical word line structure, the row decoder 102 selects the memory cell mat (main word line MWL) within the memory cell array (memory bank), based on a result of decoding of a predetermined bit field constituting a portion of a plurality of bits that form a row address, and selects one of the word lines (SWLs) within one of the memory cell mats, based on the remainder of the bits of the row address. That is, the row decoder 102 includes an FX driver (FX_drv: first row decoding unit) 1021 that supplies a driving signal FX (composed of outputs FXT_0~FXT_3) to the sub word drivers (SWDs) and main word drivers (MWDs: second row decoding units) 1022. The four-bit outputs FXT_0 to FXT_3 of the FX driver (FX_drv) 1021 are supplied in common to a plurality of the sub word drivers (SWDs) 1013 provided corresponding to a plurality of the memory mats 1012.

Each main word driver (MWD) 1022 drives the main word line WL corresponding to selected ones of the memory mats, based on a result of decoding of a row address. When activated, the main word line MWL is set to a Low level. Cine a n word line MWL is provided for a row of the memory mats 1012. MWL_k (k=1, 2, 3, ... ) indicates the main word line MWL associated with a kth memory cell mat Each of the sub word drivers (SWD) 1013 associated with the kth memory cell mat row receives the main word line MWL_K, and selects one of four word lines (SWLs) corresponding to an output FXT of a high potential, based on the outputs FXT_0 to FXT_3, and drives the selected word line (SWL) to a high voltage (voltage of the output FXT). Referring to FIG. 2, it is configured that the FX signal is composed of four bits and four word lines SWLs are assigned to one main word line MWL. It may also be as a matter of course configured that two, eight, or sixteen SWLs are assigned to one main word line MWL.

FIG. 3 is a diagram illustrating an example of a circuit configuration of each sub word driver (SWD) 1013 in FIG. 2.

As mentioned above, four word lines (SWLs) are assigned to one main word line MWL, and one of the four word lines SWLs is selectively activated to a high potential by the FX signal (composed of the outputs FXT_0 to FXT_3), in the configuration in FIG. 2. The outputs FXT corresponding to the other three word lines SWLs hold an inactive state (of a low potential). Referring to FIG. 3, reference symbols FXB_0 to FXB_3 respectively denote complementary signals of signals FXT_0 to FXT_3 in FIG. 2.

With respect to four word lines SWL_k0 to SWL_k3 output from the sub word driver (SWD) that receives the main word line MWL_k, it is assume that the signal FXT_i (i being one of 0, 1, 2, and 3) is High and the complementary signal FXB_i is Low, when the main word line MWL_k is Low (activated). Then, the word line SWL_ki is driven to the potential of the signal FXT_i and each of the remaining three word lines other than the word line SWL_ki is set to a Low potential.

Referring to FIG. 3, the sub word driver includes:
PMOS transistors PM1_i=0, 1, 2, 3) having sources connected to the signals FXT_i=0, 1, 2, 3),
NMOS transistors NM1_i (i=0, 1, 2, 3) having sources connected to a negative power supply VKK, having drains connected to drains of the PMOS transistors PM1_i, and having gates, together with gates of the PMOS transistors PM1_i, connected in common to the main word line MWL_k, and
NMOS transistors NM2_i (i=0, 1, 2, 3) having sources connected to the negative power supply VKK, having drains thereof connected to the word lines SWL_ki (i=0, 1, 2, 3), and having gates thereof connected to the signals FXB_i. Though no particular limitation is imposed, a negative word line system, for example, is adopted in this exemplary embodiment. In this system, voltages of the word lines (word lines that have not been selected by the row decoder 102) connected to the memory cells that have not been selected are set to the negative voltage VKK in order to diminish leak currents of the memory cells.

When one out of the signals FXT_0 to FXT_3 or the signal FXT_0, for example, is set to a high potential (the signal FXB_0 is set to be Low), the remaining signals FXT_1, FXT_2, and FXT_3 are set to be Low (the signals FXB_1 FXB_2, and FXT_B are all set to high potentials). In case the main word line MWK_k is selected and activated (MWK_k is set to be Low) in this case, the PMOS transistor PM1_0 having a source connected to the signal FXT_0 is turned on, the NMOS transistor NM1_0 is turned off, and the NMOS transistor NM2_0 is turned off. The word line SWL_k0 is pulled up from a negative potential VKK to the potential of the signal FXT_0. In this case, the PMOS transistors PM1_1, PM1_2, and PM1_3 are turned off, the NMOS transistors NM1_1, NM1_2, and NM1_3 are turned on, the NMOS transistors NM2_1, NM2_2, and NM2_3 are turned on, and the word lines SWL_k1, SWL_k2, and SWL_k3 are all set to the negative power supply voltage VKK.

When one of the signals FXT_0 to FXT_3, or the signal FXT_0, for example, is set to the high potential (the signal FXB_0 is set to be Low) and then the main word line MWK_k is not selected (MWK_k is set to a High potential), the NMOS transistor NM1_0 is turned on, the PMOS transistor PM1_0 is turned off, and the word line SWL_k0 is set to the negative power supply voltage VKK. In this case, the remaining signals FXT_1, FXT_2, and FXT_3 are all set to Low potentials, and the signals FXB_1. FXB_2, and FXB_3, which are the complementary signals of these signals FXT_1, FXT_2, and FXT_3, are all set to High potentials. For this reason, the NMOS transistors NM2_1 NM2_2, and NM2_3 are all turned on. The gates of the PMOS transistor PM1_1 to PM1_3 with the sources thereof respectively connected to the signals FXT_1 to FXT_3 set to the Low potentials are set to a High potential (High potential of the main word line MWK_k), and the PMOS transistor PM1_1 to PM1_3 are all turned off, and the NMOS transistors NM1_0 to NM1_3 are turned on. For this reason, the word lines SWL_k1 to SWL_k3 are all set to the negative power supply voltage VKK through the NMOS transistors NM1_1 to NM1_3, and NM2_1 to NM2_3 each of which is in an on state. That is, when the main word line MWK_k is not selected, the word lines SWL_k0 to SWL_k3 that descendent from the main word line MWK_k are all brought into an inactive state (at the negative power supply voltage VKK) by the sub word driver (SWD).

The signal FXT is driven to a high voltage (such as the boosted potential VPP) when activated (when the word line corresponding to the signal FXT is driven). In this exemplary embodiment, the signal FXT is driven to a power supply voltage (first power supply voltage) higher than the high voltage (boosted voltage VPP) during a predetermined time period, when the word line is driven. This achieves an increase in driving speed of the word line by the sub word driver (SWD).

Figure 4:
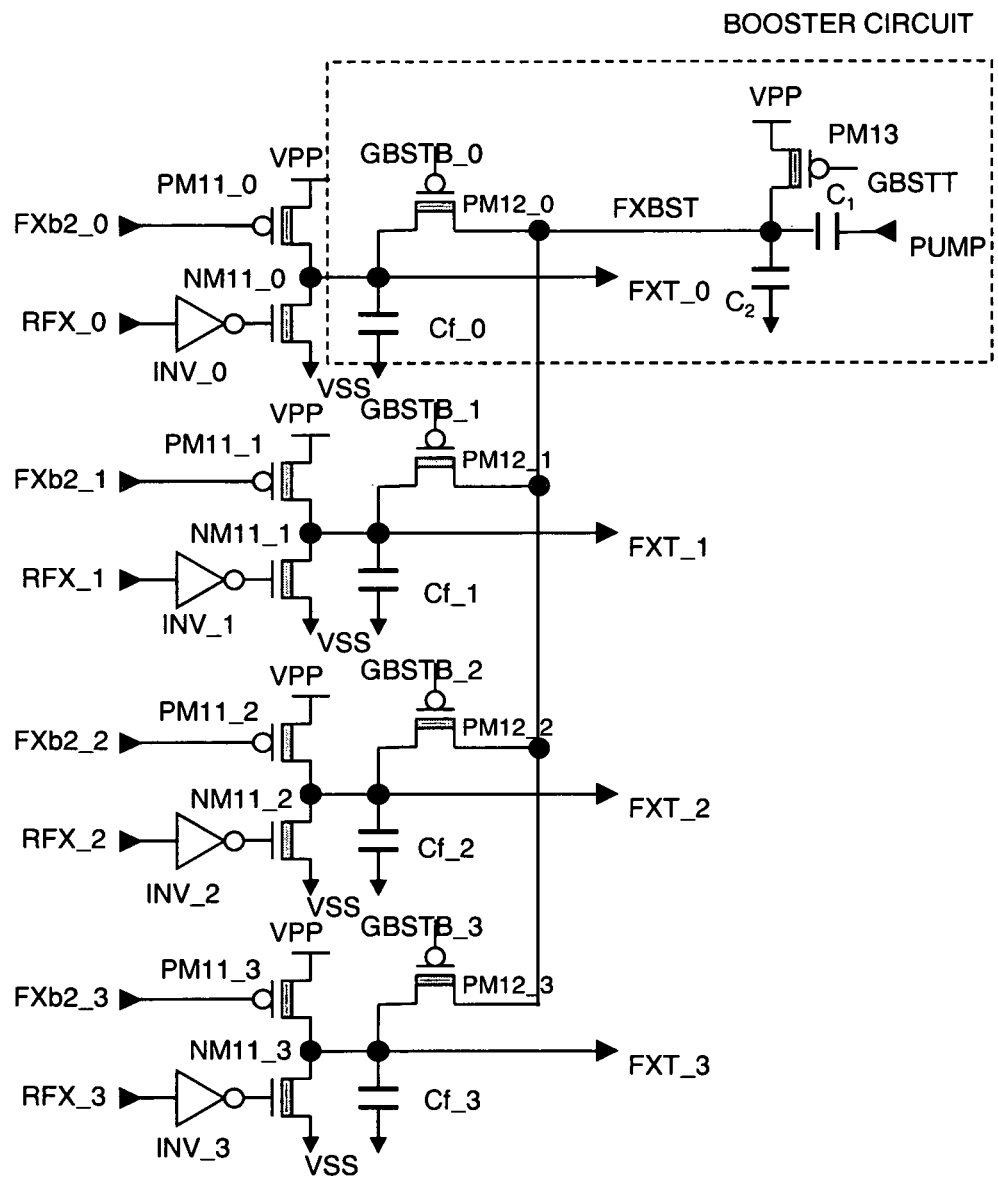
FIG. 4 is a diagram illustrating a configuration of an FX driver (Fx_drv) circuit in a first embodiment.

FIG. 4 is a diagram illustrating an embodiment of a circuit configuration of the FX driver (FX_drv) 1021 in FIG. 2. Referring to FIG. 4, reference symbols FXb2 and RFX indicate signals selectively generated with predetermined waveforms, in response to an active command (ACT) and a row address. Generation of a first power supply voltage that is a driving voltage of the signal FXT mentioned above is controlled by a control signal GBSTT (GBSTB), and a control signal PUMP.

Referring to FIG. 4, the FX driver 1021 includes PMOS transistors PM11_$i$ ($i$=0, 1, 2, 3), NMOS transistors NM11_$i$, and PMOS transistors 12_$i$ (pass transistors). A source of each of the PMOS transistors PM11_$i$ is connected to a high potential VPP, and gates of the PMOS transistor PM11_$i$=0, 1, 2, 3) respectively receive signals FXb2_$i$ ($i$=0, 1, 2, 3). A source of each of the NMOS transistors NM11_$i$ is connected to a power supply VSS, and a drain of the NMOS transistor NM11_$i$, together with the PMOS transistor PM11_$i$, are connected in common to a signal FXT_$i$, and a gate of the NMOS transistor NM11_$i$ receives a signal obtained by inverting a reset control signal RFX_$i$ by an inverter INV_$i$. Each of the PMOS transistors 12_$i$ is connected between the signal FXT_$i$ and a node FXBST, and a gate of the PMOS transistor 12_$i$ receives a control signal GBSTB_$i$. The PMOS transistor PM11_$i$ is an output transistor that drives the signal FXT_$i$ to a power supply voltage (second power supply voltage) VPP.

The FX driver further includes a booster circuit (switched capacitor circuit) that is arranged in common to the signals FXT_0 to FXT_3. The booster circuit includes a PMOS transistor PM13 that has a source connected to the power supply voltage VPP, has a gate connected to the control signal GBSTT, and has a drain connected to the node FXBST, a capacitor C1 that has one end connected to the control signal PUMP, and has the other end connected to the node FXBST, and has a capacitor C2 that has one end connected to the power supply VSS, and has the other end connected to the node FXBST. The signals FXT_0 to FXT_3 are connected to the node FXBST through the PMOS transistors 12_0 to 12_3, respectively.

Referring to FIG. 4, capacitances Cf_i ($i$=0, 1, 2, 3) connected between the respective signals FXT_i ($i$=0, 1, 2, 3) and the power supply VSS are parasitic capacitances of the respective signals FXT_i. The negative power supply VKK rather than the power supply VSS (=0V) may be employed, as a low-potential power supply.

Figure 5:
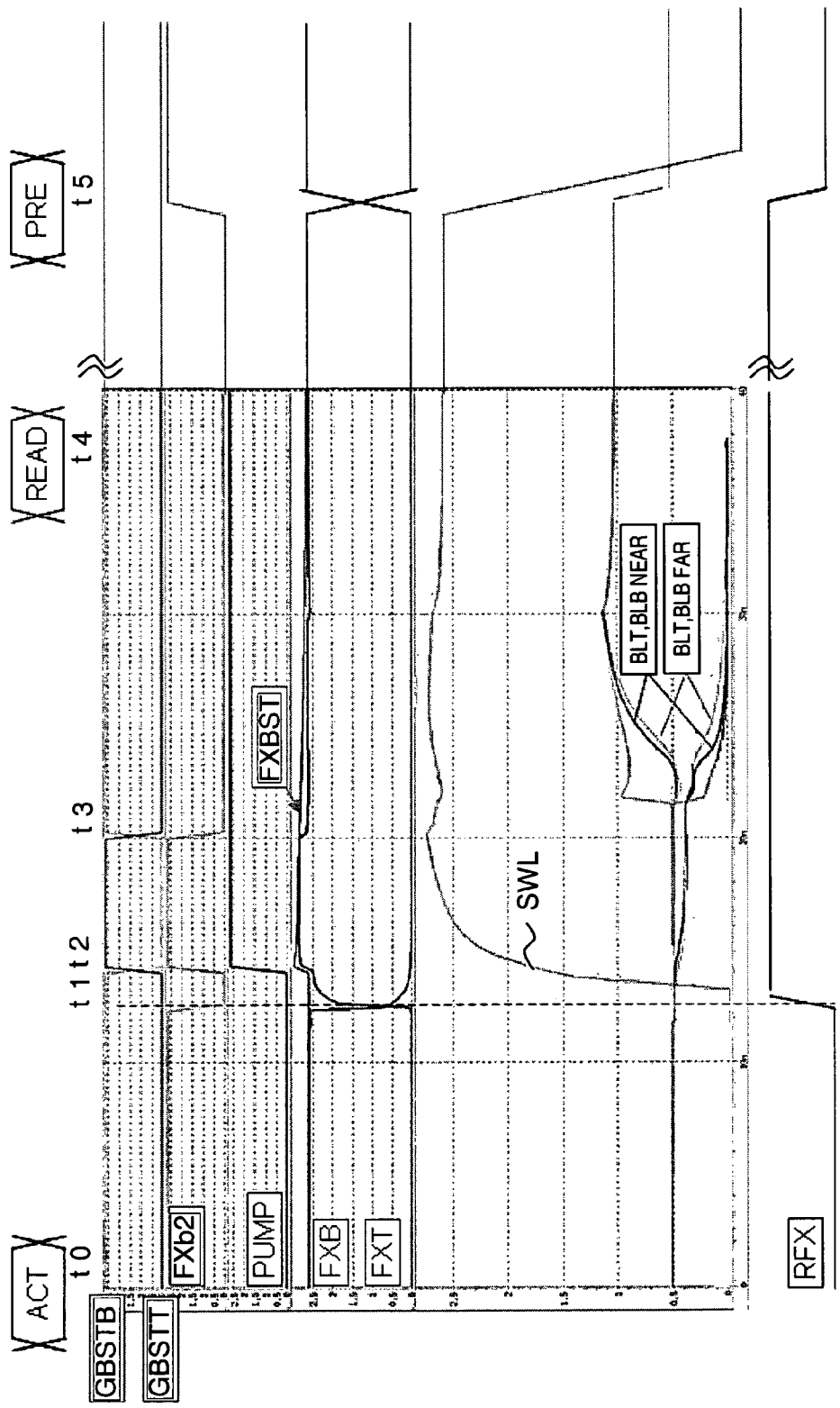
FIG. 5 is a diagram illustrating an example of operation waveforms in the first embodiment.

FIG. 5 is a waveform diagram for illustrating circuit operation of the FX driver in FIG. 4. FIG. 5 shows a portion of waveforms of a simulation result of the circuit in FIG. 4, and commands (ACT, READ, PRE), GBSTB, GBSTT, FXb2, PUMP, FXB, FXT, SWL, and RFX are shown as signals. Though a bit line pair BLT and BLB are also shown, description of the bit line pair BLT and BLB will be omitted because the bit line pair BLT and BLB are not related to the present invention. Though a suffix i of the control signal GBSTB_i ($i$=0, 1, 2, 3) is omitted from the control signal GBSTB, it is assumed that i indicates the number of a selected word line, for example. The same holds true for the signals FXb2, FXB, FXT, SWL, and RFX as well.

ACT is an activate bank command, and a bank address and a row address are received from address terminals when the ACT command is received. READ is a read command, and a column address is received when the READ command is received. WRITE is a write command, and a column address is received when the WRITE command is received. PRE is a precharge command, and a process of finishing access to the bank is performed with the PRE command. A minimum cycle interval from the ACT command to the READ command is also indicated by tRCD in a DRAM. Referring to FIG. 5, the waveforms for timings after input of the READ command are shortened on a time axis, and a time period of time corresponding to a CAS latency from input of the READ command to output of data to a terminal DQ is omitted from the drawing.

At timing t0 when the ACT command is received, the signal GBSTT is Low, a signal GBSTB_$i$ ($i$=1 to 3) is High, a signal Fxb2_$i$ is High, a signal RFX_$i$ is Low, the signal PUMP is Low, the NMOS transistors NM11_0 to NM11_3 are ON, the PMOS transistors PM11_0 to 11_03 are OFF, the PMOS transistor PM13 is ON, the PMOS transistors PM12_0 to 12_3 are OFF, the signals FXT_0 to FXT_3 are set to the Low potential (0V), and the node FXBST is set to the power supply voltage VPP (2.5V). At this point, the signals FXB_0 to FXB_3 (complementary signals of the signals FXT_0 to FXT_3) not illustrated in FIG. 4 assume the power supply voltage VPP.

At timing t1, the signal RFX_$i$ (i being one of 0 to 3) goes from Low to High, and the signal FXb2_$i$ goes Low from High, based on a result of decoding of an address signal. The NMOS transistor NM11_$i$, on receipt of the signal (Low) obtained by inverting the signal RFX_i by the inverter INV_i, turns off, and the PMOS transistor PM11_$i$, on receipt of the signal FXb2_$i$ at a gate thereof, turns on. For this reason, the signal FXT_i is pulled up toward a VPP potential by the PMOS transistor PM11_$i$. At this point, the signal FXB_i (complementary signal of the signal FXT_i) not shown in FIG. 4 assumes a Low potential.

At timing t2, the signal GBSTT goes from Low to High, the signal GBSTB_i goes from High to Low, the signal FXb2_$i$ goes from Low to High, and the signal PUMP goes from Low to High. As a result, the PMOS transistor PM13 turns off, the PMOS transistor PM12_$i$ turns on, and the FXT_i is electrically connected to the node FXBST. The PMOS transistor PM11_$i$, on receipt of the signal FXb2_$i$ which goes High at timing t2, at a gate thereof, turns off. The PMOS transistor PM11_$i$ and the transistor NM11_$i$ in an OFF state and are electrically disconnected from the signal FXT_i.

Then, when the signal PUMP goes from Low to High (VPP) at the timing t2, a potential of the node FXBST that has been charged to the VPP potential at that point of time, is boosted by the capacitor C1.

Assume herein that the capacitor C2 between the node FXBST and the power supply VSS is not present, and the node FXBST is in a completely floating state. Then, the other end (at the power supply voltage VPP) of the capacitor C1 having the one end connected to the signal PUMP will be boosted to substantially twice the voltage VPP, due to a rise of this PUMP signal from Low to High (VPP) (node FXBST assumes the voltage twice as large as the voltage VPP). In this embodiment, however, the node FXBST is connected to the power supply VSS through the capacitor C2, and is further connected to the signal FXT_i through the PMOS transistor PM12_i in an on state (parasitic capacitance Cf_i is connected to the signal FXT_i). For this reason, the potential of the node FXBST becomes VPP+ΔV (0<ΔV<VPP). Though no particular limitation is imposed, the boosted voltage of the node FXBST (corresponding to a first power supply voltage in claims) becomes close to 3V, for the voltage VPP=2.5V. Capacitance values of the capacitors C1 and C2 are appropriately set, based on the parasitic capacitance Cfx, and a pulse width of the signal PUMP, for example. The potential of this node FXBST is transmitted to the signal FXT_i through the PMOS transistor PM12_i in an on state, and is supplied to the source of a PMOS transistor PM1_i of a sub word driver to set a word line WL_ki (SWL) to a voltage further higher than the voltage VPP.

Then, at timing t3, the signals GBSTT and FXb2_i go from High to Low, the signal GBSTB_i goes from Low to High, the PMOS transistor PM13 turns on, the PMOS transistor PM11_i turns on, and the PMOS transistor PM12_i turns off. For this reason, the signal FXT_i and the node FXBST are electrically disconnected, thereby stabilizing the signal FXT_i to which the drain of the transistor PM11_i in an on state is connected to the VPP potential. As described above, the signal FXT that gives a high-potential power supply voltage for a selected word line is set to be higher than the voltage VPP (second power supply voltage) during a time period from the timing t2 to the timing t3 (corresponding to a first time period in claims), and is kept to be at the voltage VPP in a time period after the timing t3 (corresponding to a second time period in the claims) until the signal FXT is reset.

At timing t4, the READ command and a column address are received. The column switch of a selected column is turned on by a column selection signal output as a result of decoding the column address by the column decoder. Data amplified by the sense amplifier of the selected column (bit line) output to an input/output line to be output from a terminal DQ.

The precharge command PRE is received at timing t5. Then, the signal FXb2_i goes High, the signal RFX_i goes Low, the signal RFX_i goes Low, the PMOS transistor PM11_i turns off, the NMOS transistor NM11_i turns on, and the signal FXT is set to a VSS potential.

Timing control of the control signals (GBSTB, GBSTT, FXb2, PUMP, RFX) whose timing waveforms are shown in FIG. 5 is performed, based on a timing signal from the timing generator 112 in FIG. 1.

Figure 6:
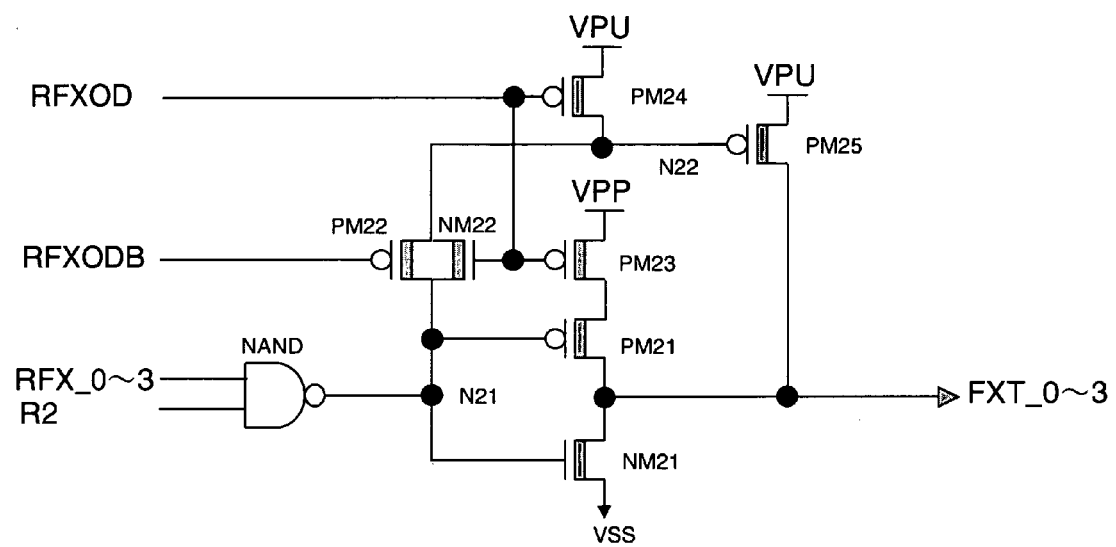
FIG. 6 is a diagram illustrating a configuration of a driving circuit in an FX driver (Fx_drv) circuit in a second embodiment.

FIG. 6 is a diagram illustrating another embodiment of the configuration of the FX driver (driving circuit in the FX driver). In this embodiment, a power supply voltage VPU (VPU>VPP) is generated by an internal power supply generation circuit 115. An FX driver (FX_drv) in FIG. 6 does not perform a boosting operation using a capacitor, which is different from the configuration shown in FIG. 4.

When the parasitic capacitance Cf_i of the signal FXT_i is large in the configuration in FIG. 4, electric charge of a voltage boosted by the capacitor C1 at a time of a rise of the signal PUMP may flow into this capacitance Cf_i, so that a desired boosting efficiency may not be obtained. Then, in this embodiment, the FX driver (FX_drv) does not perform a boosting operation by a capacitor, and the power supply voltage VPU (first power supply voltage) of a higher potential than a power supply voltage VPP (second power supply voltage), which is supplied to the signal FXT, is generated by the internal power supply generation circuit (115 in FIG. 1). The FX driver (FX_drv), when driving a word line, switch a voltage of the signal FXT to the voltage VPU or the voltage VPP.

Referring to FIG. 6, the driving circuit of the FX driver includes a PMOS transistor PM24 that has a source connected to a power supply (first power supply) VPU, has a gate supplied with a control signal RFXOD, and has a drain connected to a node N22;

a PMOS transistor PM25 that has a source connected to a power supply (first power supply) VPU, has a gate supplied with a control signal RFXOD, and has a drain connected to a node N22;

a NAND circuit NAND that receives a signal R2 and a control signal RFX_i (i=0, 1, 2, or 3);

a CMOS transfer gate including a PMOS transistor PM22 and a NMOS transistor NM22 both connected between an output node N21 of the NAND circuit NAND and the node N22, wherein the PMOS transistor PM22 has a gate supplied with a signal RFXODB (complementary signal of the signal RFXOD) and the NMOS transistor NM22 has a gate supplied with the signal RFXOD;

a PMOS transistor PM23 that has a source connected to a power supply (second power supply) VPP and has a gate supplied with the signal RFXOD;

a PMOS transistor PM21 has a source connected to a drain of the PMOS transistor PM23, has a gate connected to the node N21, and has a drain connected to the signal FXT_i (i=0, 1, 2, or 3); and an NMOS transistor NM21 that has a source connected to a power supply (low-potential power supply) VSS, has a gate connected to the node N21, and has a drain connected to the signal FXT_i (i=0, 1, 2, or 3). In FIG. 6, a negative power supply VKK rather than the power supply VSS may be employed, as a low-potential power supply.

Figure 7:
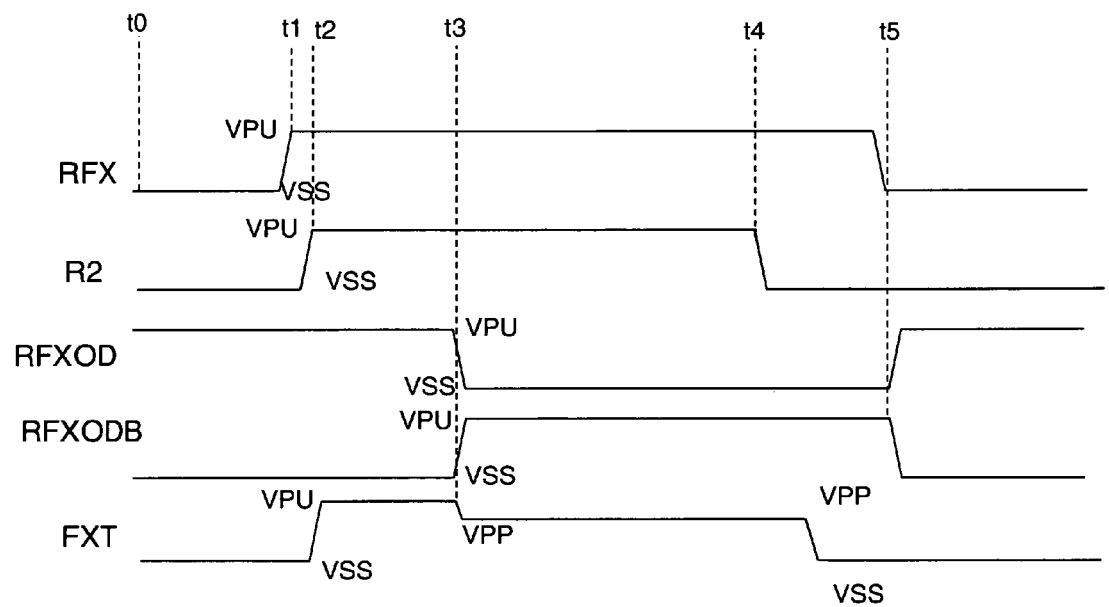
FIG. 7 is a diagram illustrating an example of operation waveforms in the second embodiment.

FIG. 7 is a signal waveform diagram illustrating an example of operation in the second embodiment. FIG. 7 shows signal waveforms of signals RFX, R2, RFXOD, RFXODB, and FXT in FIG. 6. The signals RFX and FXT respectively correspond to a selected one of signals RFX_i and a selected one of signals FXT_i (i=0 to 3). In the following description, a suffix (_i) in each of the signals RFX_i and FXT_i will be omitted. Timings t0 to t5 correspond to the timings t0 to t5 in FIG. 5. An ACT command, a READ command, and a PRE command are respectively received at the timings t0, t4, and t5.

At the timing t0, the signal RFX is Low (VSS), the signal R2 is Low, the signal RFXOD is High (VPU), and the signal RFXODB is Low. The output node N21 of the NAND circuit NAND is High. The NMOS transistor NM21 turns on and the PMOS transistors PM23 and PM24 turn off. The CMOS transfer gate (PM22, NM22) turns on, a High potential at the node N21 is transmitted to the node N22, the PMOS transistor PM25 turns off, and the signal FXT is set Low (VSS).

At timing t1, the signal RFX rises from Low (VSS) to High (VPU), the signal R2 rises from Low (VSS) to High (VPU) at timing slightly delayed from timing t1, so that the output node N21 of the NAND circuit NAND goes Low.

When the node N21 goes Low, the NMOS transistor NM21 turns off. Since the CMOS transfer gate (PM22, NM22) is in an on state, the Low potential of the node N21 is transmitted to the node N22. The PMOS transistor PM25 then turns on, and the signal FXT rises from the voltage VSS to the voltage VPU.

At timing t3, the signal RFXOD goes Low (VSS), the signal RFXODB goes High (VPU), and the CMOS transfer gate (PM22, NM22) turns off. In response to transition of the signal RFXOD from High to Low (VSS), the PMOS transistors PM24 and PM23 turn on. The node N22 connected to the drain of the PMOS transistor PM24 is pulled up to a VPU potential by the PMOS transistor PM24 which turns on. Then, the PMOS transistor PM25 turns off. At this point, the node N21 is Low (VSS), and the PMOS transistor PM21 is on. Accordingly, the signal FXT is connected to the power supply voltage VPP through the PMOS transistors PM21 and PM23 in an on state. For this reason, the voltage of the signal FXT falls from the voltage VPU to the voltage VPP at the timing t3.

At the timing t4, the signal R2 goes Low (VSS), the output node N21 of the NAND circuit NAND goes High, the NMOS transistor NM21 turns on, and the voltage of the signal FXT becomes the voltage VSS. Since the signal RFXOD is Low (VSS) and the signal RFXODB is High (VPU) in this case, the CMOS transfer gate (PM22, NM22) turns off. Since the PMOS transistor PM24 is on, the node N22 is at the power supply voltage VPU, and the PMOS transistor PM25 therefore turns off. Further, the PMOS transistor PM23 is on, but the PMOS transistor PM21 turns off. Accordingly, the voltage of the signal FXT becomes the voltage VSS.

At the timing t5, the signal RFX goes Low, the signal RFXOD goes High (VPU), the signal RFXODB goes Low, and the CMOS transfer gate (PM22, NM 22) turns on, the PMOS transistors PM24 and PM23 turn off, and the High potential of the node N21 is transmitted to the node N22. The PMOS transistor PM25 turns off, the NMOS transistor NM21 is on, and the voltage of the signal FXT is kept to be at the voltage VSS.

Timing control of the control signals (RFX, R2, RFXOD, RFXODB) whose timing waveforms are shown in FIG. 7 is performed, based on a timing signal from the timing generator 112 in FIG. 1.

The need for the capacitance for the signal PUMP in the first embodiment is eliminated in the second embodiment. Thus, the second embodiment is effective when the parasitic capacitance Cf of the signal FXT is large. Further, control of a boosted voltage can be readily performed. The power supply VPU (first power supply) is a power supply (generated by the internal power supply voltage generation circuit) different from the power supply VPP (second power supply). Thus, voltage adjustment after the increase of the voltage of the signal FXT is facilitated.

FIG. 8 is a diagram illustrating a still another embodiment of the configuration of the FX driver (driving circuit in the FX driver). In this embodiment, when a signal FXT rises, resetting and driving is performed at a time using all PMOS transistors, so that good efficiency is provided, and the configuration of the FX driver is simplified. Referring to FIG. 8, the driving circuit of the FX driver includes:

a PMOS transistor PM31 that has a source connected to a power supply VPU and has a gate connected to a signal RFX_i (i=0, 1, 2, or 3);

an NMOS transistor NM31 that has a source connected to a power supply VSS, has a drain connected to a drain of the PMOS transistor PM31, and has a gate connected to a signal RFX_i;

a PMOS transistor PM32 that has a source connected to a power supply VFX and has a gate connected to commonly coupled drain nodes N32 of the PMOS transistor PM31 and the NMOS transistor NM31;

an NMOS transistor NM32 that has a source connected to a power supply VSS, has a drain together with a drain of the PMOS transistor PM32 connected to a signal FXT_i (i=0, 1, 2, or 3), and has a gate thereof connected to the node N32;

a NAND circuit NAND that receives a signal RFXOD and the signal RFX_i (i=0, 1, 2, or 3); and a PMOS transistor PM33 that has a source connected to the power supply VPU, has a gate thereof connected to an output node N31 of the NAND circuit NAND, and has a drain connected to the signal FXT_i (i=0, 1, 2, or 3). A negative power supply VKK rather than the power supply VSS may be employed as a low-potential power supply.

Figure 9:
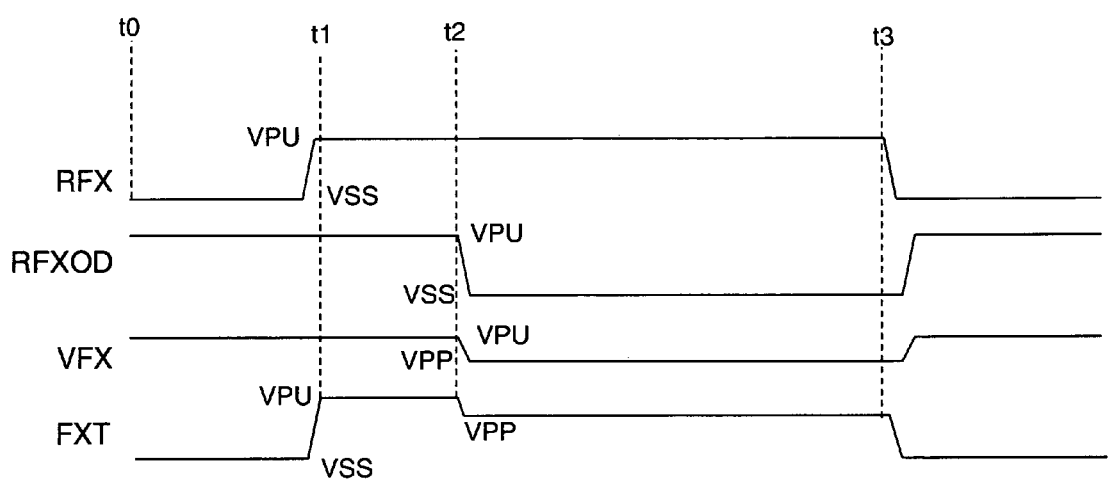
FIG. 9 is a diagram illustrating an example of operation waveforms in the third embodiment.

FIG. 9 is a waveform diagram illustrating the operation of a third embodiment. Timings t0, t1, t2, and t3 correspond respectively to the timings to, t1, t3, and t5 in FIG. 4. Reference symbol RFX indicates a selected one of the signals RFX_0 to RFX_3 in FIG. 8, and a suffix added to the signal RFX_i will be omitted in the following description.

At the timing t0, the signal RFX is Low, the signal RFXOD is High (VPU), and a power supply voltage VFX is High (VPU), and the output node N31 of the NAND circuit NAND is High (VPU). Thus, the PMOS transistor PM33 is off. Since the signal RFX is Low (VSS), the PMOS transistor PM31 turns on and the node N32 is High (VPU). The NMOS transistor NM32 turns on, and a voltage of the signal FXT is set to a voltage VSS (VSS).

At the timing t1, the signal RFX rises to High (VPU), the PMOS transistor PM31 turns off and the NMOS transistor NM31 turns on. The node N32 goes Low (VSS), the PMOS transistor PM32 turns on and the NMOS transistor NM32 turns off. The output node N31 of the NAND circuit NAND goes Low (VSS), the PMOS transistor PM33 turns on, and the voltage of the signal FXT rises from the voltage VSS to a voltage VPU through the PMOS transistors PM33 and PM32 in an on state. A potential of the power supply voltage VFX at this point is set to the voltage VPU, and the sources of the PMOS transistors PM32 and PM33 are set to have the common potential.

At the timing t2, the signal RFXOD goes Low from High (VPU), the output node N31 of the NAND circuit NAND goes High, and the PMOS transistor PM33 turns off. At this timing t2, the signal RFX remains High (VPU), the node N32 remains Low, the PMOS transistor PM32 is kept on, and the NMOS transistor NM32 is kept off. Accordingly, the signal FXT is set to a potential of the power supply voltage VFX through the PMOS transistor PM32 in the on state. At the timing t2, the power supply voltage VFX is switched from the power supply voltage VPU to a voltage VPP. Accordingly, the signal FXT is set to a VPP potential through the PMOS transistor PM32 in the on state.

At the timing t3 (when a PRE command is supplied), the signal RFX goes Low from High (VPU). Further, the signal RFXOD goes High (VPU), the power supply voltage VFX assumes the voltage VPU, and the signal FXT assumes the voltage VSS.

Timing control of the control signals (RFX,RFXOD) whose timing waveforms are shown in FIG. 9, timing control for switching the power supply voltage of the power supply VFX, are performed, based on a timing signal from the timing generator 112 in FIG. 1.

Each disclosure of the Patent Document listed above is incorporated herein by reference. Modifications and adjustments of the exemplary embodiment and the examples are possible within the scope of the overall disclosure (including claims) of the present invention, and based on the basic technical concept of the invention. Various combinations and selections of various disclosed elements are possible within the scope of the claims of the present invention. That is, the present invention of course includes various variations and modifications that could be made by those skilled in the art according to the overall disclosure including the claims and the technical concept.

What is claimed is:

1. A semiconductor device comprising:
   a memory cell transistor;
   a word line connected to the memory cell transistor; and
   a word driver driving the word line when the word line is selected;
   wherein, to activate the word line when the word line is selected, the word driver drives the word line during an activation period associated with a single operation with a first power supply voltage and with a second power supply voltage, and
   wherein the activation period associated with the single operation includes a first time period in which the first power supply voltage drives the word line and a second time period following the first time period in which the second power supply voltage drives the word line, the first power supply voltage being greater than the second power supply voltage.

2. The semiconductor device according to claim 1, wherein the word driver comprises:
   an output circuit including:
   a first transistor connected between a high-potential power supply terminal and the word line, the first transistor being turned on to drive the word line to a potential of the high-potential power supply terminal when the word line is selected; and
   a second transistor connected between the word line and a low-potential power supply terminal, the second transistor being turned on to set the word line to a low potential when the word line is not selected, the semiconductor device further comprising:
   a driving power supply circuit including an output connected to the high-potential power supply terminal of the output circuit of the word driver,
   the driving power supply circuit providing the first power supply voltage and the second power supply voltage to the high-potential power supply terminal of the output circuit when the selected word line is activated.

3. The semiconductor device according to claim 2, wherein the driving power supply circuit comprises:
   a booster circuit including
   a first capacitor having one end connected to a node charged with the second power supply voltage, when activating the selected word line,
   the boosting circuit switching another end of the first capacitor from a low potential to the second power supply voltage to boost the node to the first power supply voltage having a higher potential than the second power supply voltage,
   the driving power supply circuit supplying from the output thereof the first power supply voltage at the node boosted by the booster circuit to the high-potential power supply terminal of the output circuit of the word driver, in the first time period,
   the driving power supply circuit electrically disconnecting the node of the booster circuit from the output and supplying the second power supply voltage to the high-potential power supply terminal of the output circuit of the word driver, in the second time period.

4. The semiconductor device according to claim 2, wherein the word driver comprises:
   a plurality of the output circuits respectively connected to a plurality of the word lines,
   the plurality of output circuits receiving in common a main word line provided for the plurality of the word lines, wherein
   when the main word line is selected and one of the plurality of the word lines is selected as a result of decoding of a row address, one of the plurality of output circuits connected to the selected word line drives the selected word line with the power supply voltage supplied to the high potential power supply terminal from the driving power supply circuit, while a low potential is supplied to the high-potential power supply terminal of each of a plurality of the output circuits connected to a plurality of remaining the word lines not selected from the output of the driving power supply circuit, the output corresponding to the high-potential power supply terminal of the output circuit, and
   when the main word line is not selected and is in a deactivated state, the plurality of the output circuits receiving the main word line in common, set the plurality of the word lines to a low-potential power supply voltage.

5. The semiconductor device according to claim 4, wherein the driving power supply circuit comprises:
   a plurality of driving circuits respectively corresponding to the plurality of the output circuits, each of the plurality of driving circuits comprising:
   a third transistor receiving a first signal produced as a result of decoding of the row address, the third transistor being turned on to drive the output to the second power supply voltage when the first signal indicates that the word line is selected; and
   a fourth transistor receiving a second signal produced as the result of decoding of the row address, the fourth transistor being turned on to set the output to a low potential when the second signal is deactivated,
   the booster circuit provided in common to the plurality of the output circuits; and
   a plurality of first switch elements connected between the node of the booster circuit and the output of each of the plurality of driving circuits, wherein
   after the third transistor of the driving circuit connected to the high-potential power supply terminal of the output circuit connected to the selected word line drives the output to the second power supply voltage,
   in the first time period, the third transistor is turned off, one of the first switch elements connected to the output of the driving circuit connected to the high-potential power supply terminal of the output circuit connected to the selected word line is turned on to connect the boosted node to the output of the driving circuit, and the first power supply voltage is supplied to the high-potential power supply terminal of the output circuit from the output to drive the selected word line to the first power supply voltage, and
   in the second time period following the first time period, the first switch element is turned off, the third transistor is turned on again to set the output of the driving circuit to the second power supply voltage, and the second power supply voltage is supplied to the high-potential power supply terminal of the output circuit to set the selected word line to the second power supply voltage.

6. The semiconductor device according to claim 5, wherein the booster circuit comprises:
   a second switch element connected between the node and a power supply terminal supplied with the second power supply voltage, the second switch element being turned on immediately before the first time period to charge the node to the second power supply voltage, the second switch element being turned off in the first time period; and
   a second capacitor between the node and a low-potential power supply terminal.

7. The semiconductor device according to claim 2, comprising:
   first and second power supplies respectively generating the first and second power supply voltages, wherein
   the driving power supply circuit comprises:
      a driving circuit including:
         a fifth transistor connected between the output and a first power supply terminal supplied with the first power supply voltage from the first power supply;
         a sixth transistor connected between the output and a second power supply terminal supplied with the second power supply voltage from the second power supply; and
         a circuit that performs control such that the output connected to the high-potential power supply terminal of the output circuit connected to the word line not selected is set to a low potential, based on a signal output as a result of decoding of a row address,
      in the first time period, the high-potential power supply terminal of the output circuit connected to the selected word line is driven with the first power supply voltage by turning on the fifth transistor and turning off the sixth transistor, and
      in the second time period, the high-potential power supply terminal of the output circuit connected to the selected word line is driven by the second power supply voltage by turning off the fifth transistor and turning on the sixth transistor.

8. The semiconductor device according to claim 7, wherein the driving circuit further comprises
   a circuit setting the high-potential power supply terminal of the output circuit connected to the word line not selected to the low potential.

9. The semiconductor device according to claim 2, comprising:
   a first power supply generating the first power supply voltage; and
   a third power supply, a power supply voltage generated by the third power supply being switched between the first power supply voltage and the second power supply voltage, wherein
   the driving power supply circuit comprises:
      a driving circuit including:
         a first circuit arranged between a power supply terminal of the first power supply and a low-potential power supply terminal, the first circuit receiving a signal output as a result of decoding of a row address;
         a second circuit arranged between a power supply terminal of the third power supply and a low-potential power supply terminal, the second circuit receiving an output of the first circuit;
         a third switch element arranged between a power supply terminal of the first power supply and the output; and
         a logic circuit performing control such that when the signal output as the result of decoding of the row address indicates that the word line is selected, the third switch element is turned on in the first time period and the third switch element is turned off in the second time period, based on a signal that controls the first time period and the signal output as the result of decoding of the row address, wherein
      in the first time period; the third switch element is turned on, a voltage of the third power supply is set to the first power supply voltage, the output is set to the first power supply voltage, the driving circuit driving the high-potential power supply terminal of the output circuit connected to the selected word line with the first power supply voltage, and
      in the second time period, a voltage of the third power supply is switched to the second power supply voltage, the third switch element is turned off, the output is set to the second power supply voltage that is a voltage of the third power supply output from the second circuit, the driving circuit driving the high-potential power supply terminal of the output circuit connected to the selected word line with the second power supply voltage.

10. The semiconductor device according to claim 7, wherein the word driver comprises:
   a plurality of the output circuits respectively connected to a plurality of the word lines,
   the plurality of the output circuits receiving in common a main word line provided for the plurality of the word lines, wherein
   the semiconductor device comprises a plurality of the driving circuits corresponding respectively to the plurality of the output circuits.

11. The semiconductor device according to claim 9, wherein the word driver comprises:
   a plurality of the output circuits respectively connected to a plurality of the word lines,
   the plurality of the output circuits receiving in common a main word line provided for the plurality of the word lines, wherein
   the semiconductor device comprises a plurality of the driving circuits corresponding respectively to the plurality of the output circuits.

12. A semiconductor device comprising:
   a word line;
   a bit line;
   a memory cell transistor coupled to the word line and the bit line, outputting memory cell data to the bit line when the word line is activated; and
   a word line driver configured to activate the word line by supplying the word line with a first voltage and then a second voltage different from the first during an activation period associated with a single operation, the activation period including a first time period in which the word line is supplied with the first voltage followed by a second time period in which the word line is supplied with the second voltage, wherein the first period is shorter than the second period.

13. The semiconductor device according to claim 12, wherein the memory cell transistor does not output the memory cell data to the bit line when the word line is inactivated and the word line driver supplies the word line with a third voltage different from the first and second voltages to inactivate the word line.

14. The semiconductor device according to claim 13, wherein the first voltage is greater than the second voltage and the second voltage is greater than the third voltage.

15. The semiconductor device according to claim 12, wherein the word driver includes an internal power supply terminal, the semiconductor device further comprising:
   first and second power supply terminal supplied with the first and second voltages, respectively;
   a first transistor coupled between the first power supply terminal and the internal power supply terminal; and
   a second transistor coupled between the second power supply terminal and the internal power supply terminal.

16. The semiconductor device according to claim 15, wherein the first transistor turns on and the second transistor turns off to supply the word line with the first voltage via the internal power supply terminal during the first time period, the first transistor turning off and the second transistor turning on to supply the word line with the second voltage via the internal power supply terminal during the second time period.

17. The semiconductor device according to claim 16, wherein the word driver includes an additional power supply terminal supplied with a third voltage and a third transistor coupled to the additional power supply terminal, the third transistor turning on to supply the word line with the third voltage during a third time period following the second time period.

18. The semiconductor device according to claim 12, further comprising a memory cell coupled to the memory cell transistor, and the memory cell storing the memory cell data therein.

19. The semiconductor device according to claim 18, wherein the memory cell includes a non-volatile memory.

* * * * *